(12) United States Patent
Motohashi

(10) Patent No.: US 8,062,961 B1
(45) Date of Patent: Nov. 22, 2011

(54) METHOD FOR MANUFACTURING A SEMICONDUCTOR DEVICE

(75) Inventor: Norikazu Motohashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/414,011

(22) Filed: Mar. 30, 2009

Related U.S. Application Data

(60) Provisional application No. 61/040,238, filed on Mar. 28, 2008.

(51) Int. Cl.
*H01L 21/00* (2006.01)

(52) U.S. Cl. ........ 438/463; 438/113; 438/124; 438/127; 438/455; 438/456; 438/457; 438/458; 438/462; 438/464; 438/459; 257/723; 257/E33.056; 257/E23.001; 257/E23.041; 257/E21.499

(58) Field of Classification Search .................. 438/113, 438/114, 127, 455–459, 462–464; 257/723, 257/E33.56, E23.001, E23.41, E21.499
See application file for complete search history.

(56) References Cited

U.S. PATENT DOCUMENTS

| 6,770,544 | B2* | 8/2004 | Sawada | 438/462 |
| 2006/0068533 | A1* | 3/2006 | Utsunomiya | 438/149 |
| 2007/0026662 | A1* | 2/2007 | Kawano et al. | 438/618 |
| 2007/0257311 | A1* | 11/2007 | Kuwabara | 257/347 |
| 2008/0224941 | A1* | 9/2008 | Sugiyama et al. | 343/873 |

FOREIGN PATENT DOCUMENTS

| JP | 10-125929 | | 5/1998 |
| JP | 2007-035825 | | 2/2007 |
| JP | 2007035725 | * | 2/2007 |

OTHER PUBLICATIONS

Kawano et al. (JP 2007-035825) machine translation.*

* cited by examiner

*Primary Examiner* — Charles Garber
*Assistant Examiner* — Yasser A Abdelaziez
(74) *Attorney, Agent, or Firm* — Young & Thompson

(57) ABSTRACT

Provided is a method for manufacturing a semiconductor device which includes: forming a removal layer over a base (support base); forming an interconnect layer over the removal layer; mounting semiconductor chip(s) over the interconnect layer; and separating the base from the interconnect layer while inducing the separation so as to originate from the removal layer, by irradiating a laser having a wavelength transparent with respect to the support base from the back side thereof, selectively to an unmounted region having no semiconductor chip(s) mounted thereon.

17 Claims, 8 Drawing Sheets

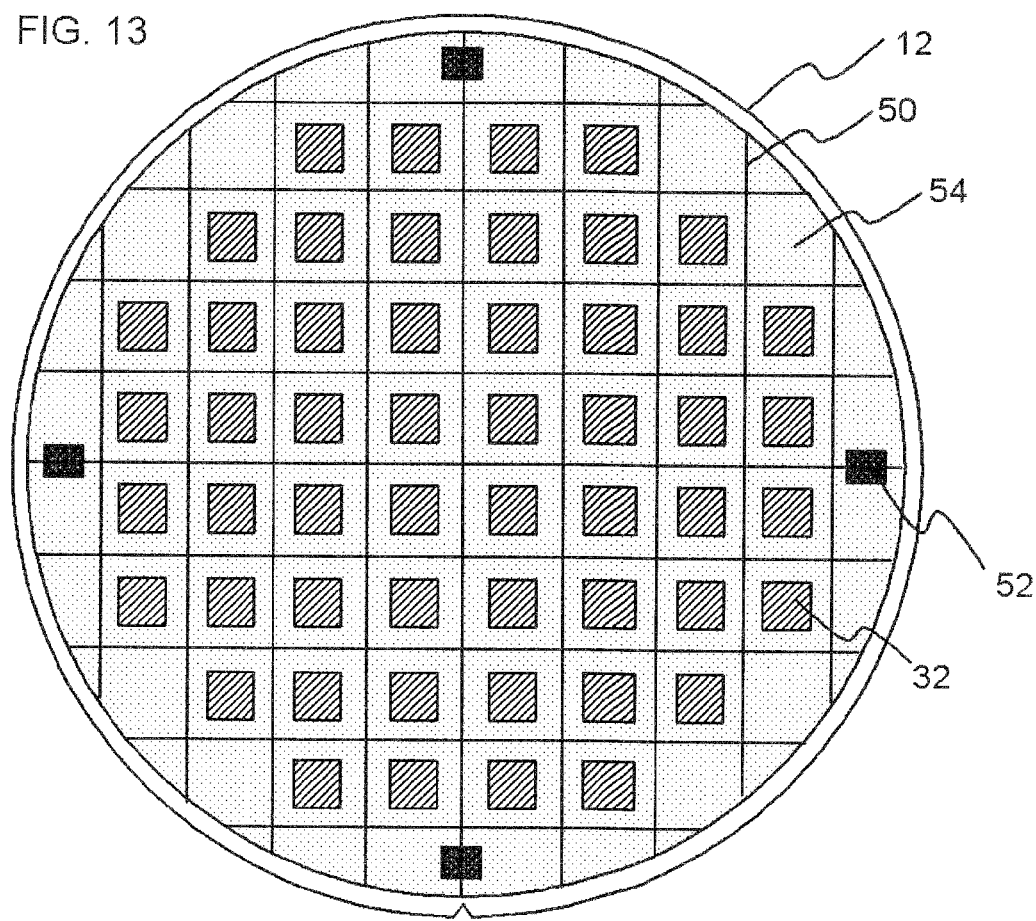

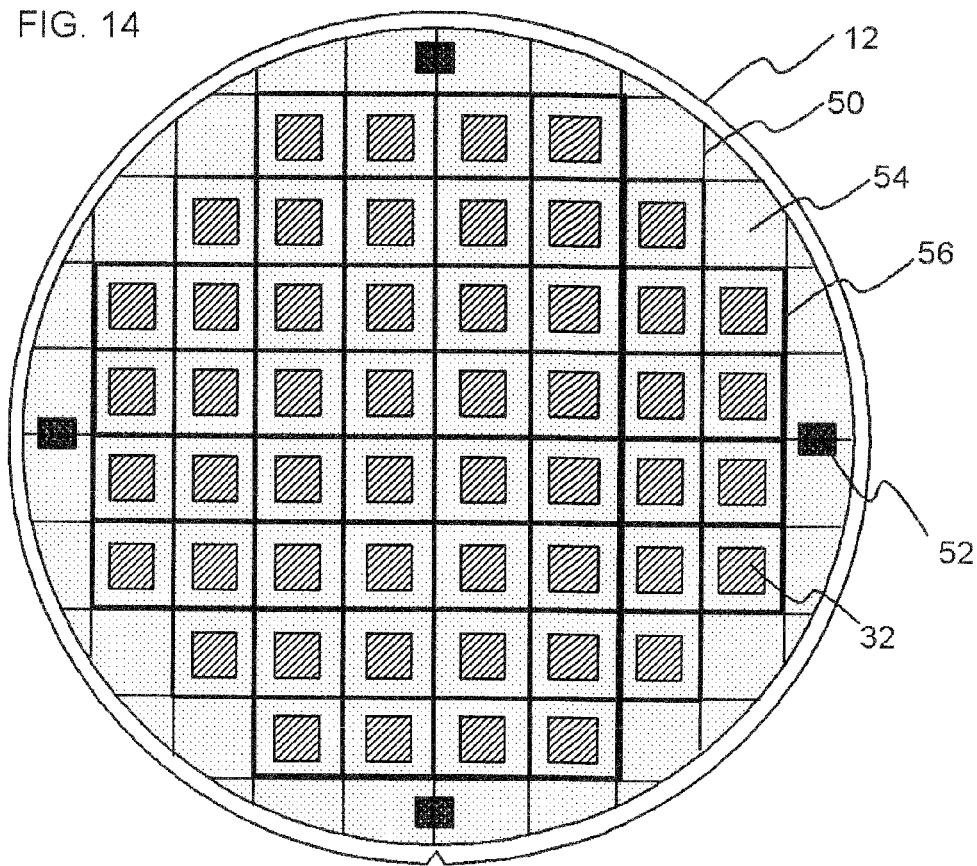

METHOD FOR MANUFACTURING A SEMICONDUCTOR DEVICE

This application claims priority under 35 U.S.C. §119 from U.S. Provisional Application Ser. No. 61/040,238 filed on Mar. 28, 2008.

BACKGROUND

1. Technical Field

The present invention relates to a method for manufacturing a semiconductor device, having a step of separating semiconductor device(s) formed over a base, from the base.

2. Related Art

Japanese Laid-Open Patent Publication No. 10-125929 describes a method of separation which includes a step of forming an object-to-be-separated over a transparent substrate, while placing a light absorption layer (amorphous silicon layer, for example) in between, and a step of irradiating a laser light from the back side of the substrate over the entire region right under the object-to-be-separated. Japanese Laid-Open Patent Publication No. 10-125929 describes that the object-to-be-separated may be separated from the substrate, because the laser irradiation induces a phase change in the light absorption layer.

Japanese Laid-Open Patent Publication No. 2007-35825 describes a method for manufacturing a semiconductor device, providing a heat-decomposable removal layer between a support substrate and a seed metal layer of a semiconductor device, and heating and decomposing the removal layer to thereby separate the seed metal layer of the semiconductor device from the support substrate. Japanese Laid-Open Patent Publication No. 2007-35825 describes that only the removal layer may be heated using a certain wavelength of laser light capable of transmitting through the support substrate but incapable of transmitting through the removal layer.

There are, however, some room for improvement in the conventional techniques described in these literatures, in the following aspects.

The technique of Japanese Laid-Open Patent Publication No. 10-125929 has been anticipated for damages possibly given to the object-to-be-separated, because the laser is irradiated over the entire region right under the object-to-be-separated. The technique of Japanese Laid-Open Patent Publication No. 10-125929 also adopts an intermediate layer including a metal reflective layer, provided over the light absorption layer, so as to suppress the laser transmission and thereby suppress the damage. Addition of this sort of component, however, complicates the process and increases the cost of manufacturing.

Another problem is that the irradiation over the entire region right under the object-to-be-separated using the laser having only a very small beam spot worsens the throughput, remained for further improvement.

The technique of Japanese Laid-Open Patent Publication No. 2007-35825 has a room for improvement in the aspects below.

First, when the laser was directly irradiated to a semiconductor chip contained in the semiconductor device, polyimide used for an interlayer insulator between interconnects, or to the removal layer right under the via plug, these components may be adversely affected by abrasion or generated heat. In particular, the via plug formed so as to penetrate the interconnect layer has a large heat conductivity. The heat may, therefore, conduct therethrough to reach an encapsulation resin, to thereby degrade the reliability of a package.

Second, irradiation of laser having a very small beam spot over the entire surface of the support substrate has been worsening a throughput, and has been remained for further improvement.

SUMMARY

According to the present invention, there is provided a method for manufacturing a semiconductor device which includes:

forming a removal layer over a base;

forming an interconnect layer over the removal layer;

mounting semiconductor chip(s) over the interconnect layer; and separating the base from the interconnect layer while inducing the separation so as to originate from the removal layer, by irradiating a laser having a wavelength transparent with respect to the base from the back side thereof, selectively to an unmounted region having no semiconductor chip(s) mounted thereon.

According to the present invention, since the laser having a wavelength transparent with respect to the base is irradiated from the back side of the base, selectively to an unmounted region having no semiconductor chip(s) mounted thereon, a damage to the object-to-be-separated as a semiconductor is reduced, so that the obtainable semiconductor device may be improved in the reliability.

Also since a gas may be produced in the removal layer, by the selective irradiation of laser to the unmounted region having no semiconductor chip(s) mounted thereon, so that the base may be separated from the interconnect layer, while inducing the separation so as to originate from the removal layer.

Since the interconnect layer and the semiconductor chip(s) mounted over the layer may be separated together from the base by such simple method, so that the separation process may be improved in the throughput, and thereby production efficiency of the semiconductor device may be excellent.

According to the method for manufacturing a semiconductor device, a semiconductor device improved in the reliability may efficiently be manufactured by such simple method.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 13 and 14 are schematic top views illustrating a semiconductor device according to the second embodiment.

DETAILED DESCRIPTION

Figure 1:
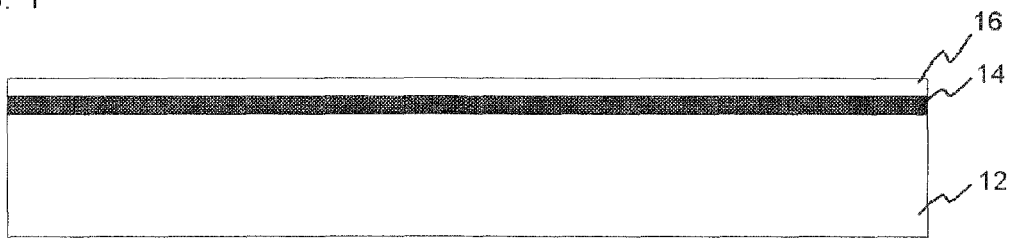
FIGS. 1 to 10 are schematic sectional views sequentially illustrating processes in a method for manufacturing a semiconductor device according to a first embodiment.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. Note that any similar constituents will be given with similar reference numerals in all drawings, and explanations therefor will not be repeated.

First Embodiment

A method for manufacturing a semiconductor device of a first embodiment will be explained, referring to FIG. 1 to FIG. 10 and FIG. 12.

The method for manufacturing a semiconductor device of this embodiment includes the steps of:

(a): forming a removal layer over a base;

(b): forming an interconnect layer over the removal layer;

(c): mounting a plurality of semiconductor chips over the interconnect layer; and (d): separating the base from the interconnect layer while inducing the separation so as to originate from the removal layer, by irradiating a laser having a wavelength transparent with respect to the base from the back side thereof, selectively to an unmounted region having no semiconductor chips mounted thereon.

The method will step-wisely be explained below.

Step (a): A removal layer 14 is formed over a base (support base 12) (FIG. 1).

First, the removal layer 14 is formed over the base (support base 12). In this embodiment, the support base 12 may be configured by a substrate made of glass, quartz glass, sapphire, aluminum nitride, silicon or the like. This embodiment will explain an exemplary case of using a glass wafer as the support base 12.

Figure 12:
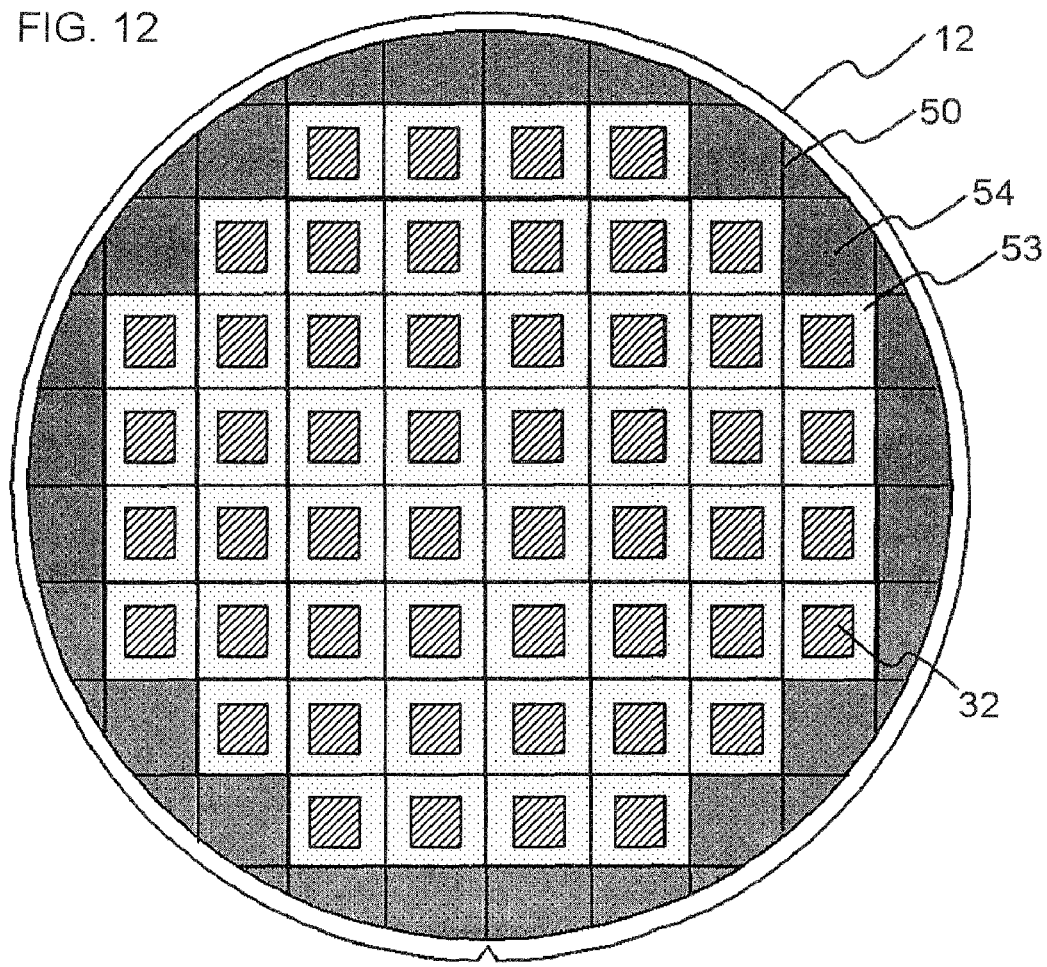
FIG. 12 is a schematic top view illustrating a semiconductor device according to the first embodiment.

FIG. 12 is a schematic top view illustrating the support base 12 of this embodiment, having a plurality of semiconductor chips 32 mounted thereon. This embodiment exemplifies a case of using the support base 12 having a size equivalent to an 8-inch wafer, as illustrated in FIG. 12. The size and geometry of the support base 12 are not limited, and may alternatively be rectangular, for example.

The removal layer 14 may contain one species or more of compounds selected from the group consisting of metal oxide, metal nitride and metal oxinitride. The metal oxide may be exemplified by copper oxides ($CuO$, $Cu_2O$, $Cu_4O_3$, etc.). The metal nitride may be exemplified by copper nitride ($Cu_3N$, etc.). The metal oxinitride may be exemplified by copper oxinitride and so forth.

This embodiment exemplifies a case of using the removal layer 14 composed of CuO. The removal layer 14 in this case may be formed by sputtering Cu over the support base 12 in an atmosphere having an oxygen flow rate of 50 sccm, an argon flow rate of 180 sccm, at an energy of 750 W, followed by annealing at approximately 310° C.

Step (b): An interconnect layer 27 is formed over the removal layer 14 (FIGS. 1 to 4).

First, a seed metal layer 16 is formed over the removal layer 14 typically by sputtering (FIG. 1).

Figure 2:
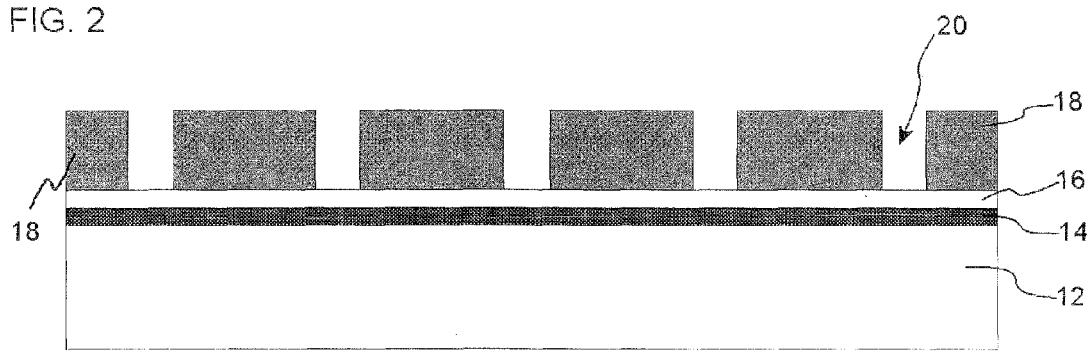

An insulating resin such as a photo-sensitive polyimide is then coated over the seed metal layer 16, and the coated film is then sintered. The temperature of sintering may be adjusted to 300° C., for example, but is necessarily lower than the temperature of annealing of the removal layer 14. In this way, an insulating resin layer may be formed. Next, the via holes 20 are formed typically by photolithography. In this way, insulating resin layer 18 having the via holes 20 formed therein may be obtained (FIG. 2).

Figure 3:
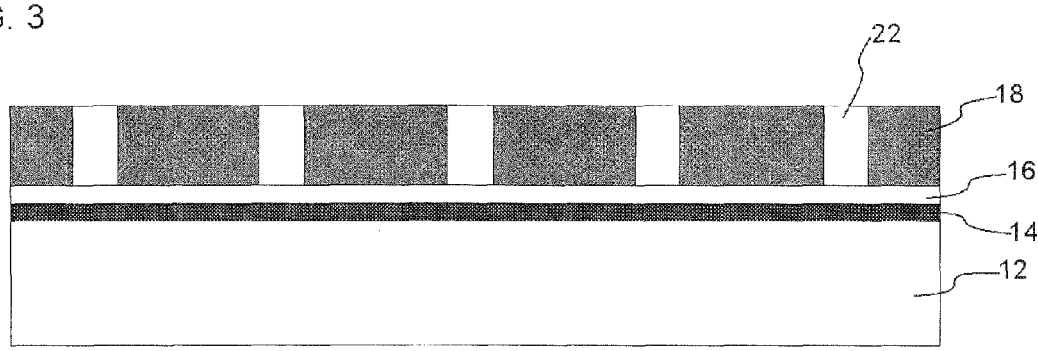

Via plugs 22 are then formed so as to fill up the via holes 20 (FIG. 3). The via plugs 22 are formed typically by electroplating of Cu/Ni, while making use of the seed metal layer 16 as a current supply layer.

Next, a Ti film and a Cu film, for example, are sequentially formed over the insulating resin layer 18 having the via plugs 22 formed therein, typically by sputtering. A resist film is then provided over the Cu film, and openings are formed in the resist film. The openings are formed where interconnects 26 are formed later.

The interconnects are then formed typically by electroplating of Cu, while making use of the seed metal layer 16 as a current supply layer. Thereafter, the resist film is removed and the Cu film and the Ti film are etched back to form patterned adhesive conductive films 24 and interconnects 26.

The etch-back herein may be proceeded by wet etching using a mixed solution of sulfuric acid and hydrogen peroxide, or hydrofluoric acid as an etching solution.

Figure 4:
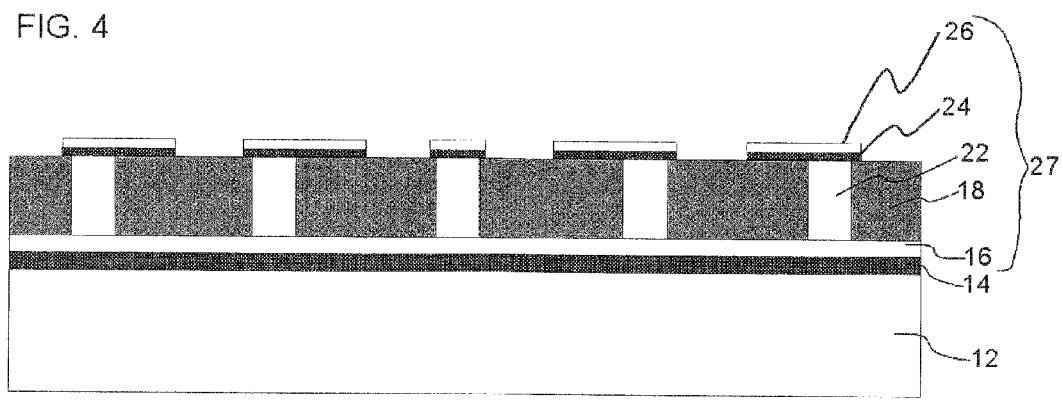

By such processes, interconnect layer 27 composed of the seed metal layer 16, the insulating resin layer 18, the via plugs 22, the adhesive conductive film 24 and the interconnects 26 are formed (FIG. 4).

Figure 5:
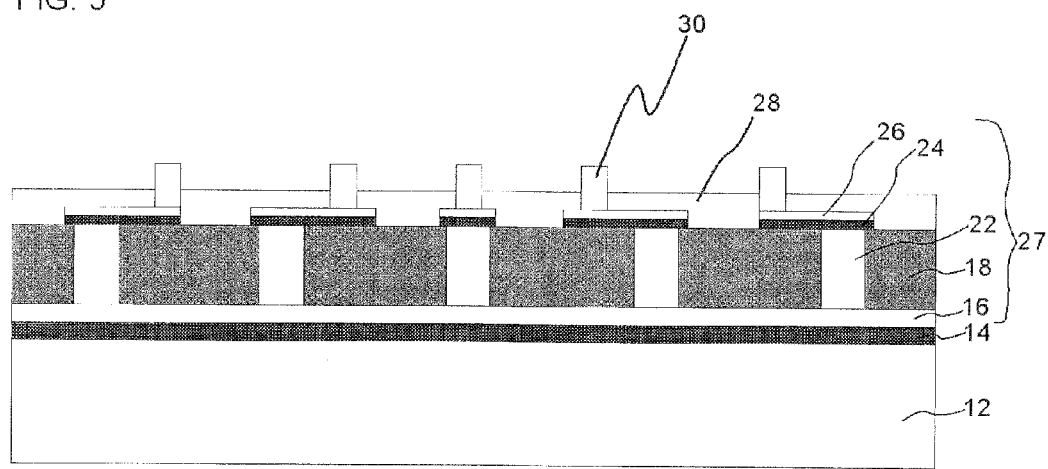

Step (c): A plurality of semiconductor chips 32 are mounted over the interconnect layer 27 (FIGS. 5 to 7).

First, a solder resist layer is formed over the insulating resin layer 18, so as to cover the adhesive conductive film 24 and the interconnects 26. Openings having the surface of the interconnects 26 exposed at the bottom thereof are then formed in the solder resist layer, typically by photolithography, to thereby form a solder resist 28 (FIG. 5).

Next, electrodes of the semiconductor chips 32 are connected to the interconnects 26 through solder layers 30 filled in openings, thereby the semiconductor chips 32 are fixed on the interconnects 26. In this embodiment, as illustrated in FIG. 12, a plurality of semiconductor chips 32 are fixed on the interconnects 26, while being spaced from each other.

Figure 6:
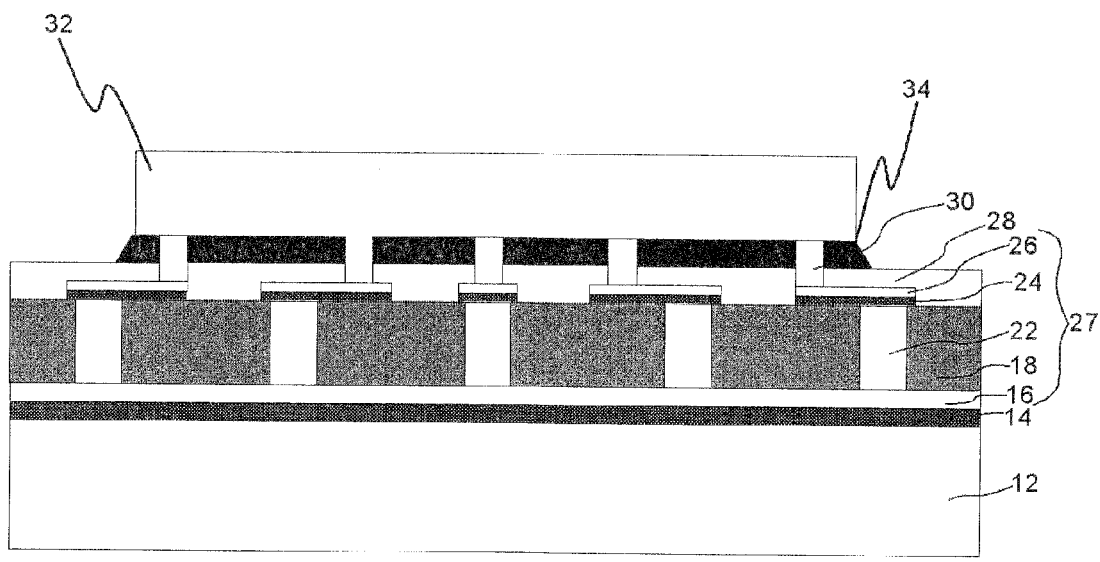
Figure 7:
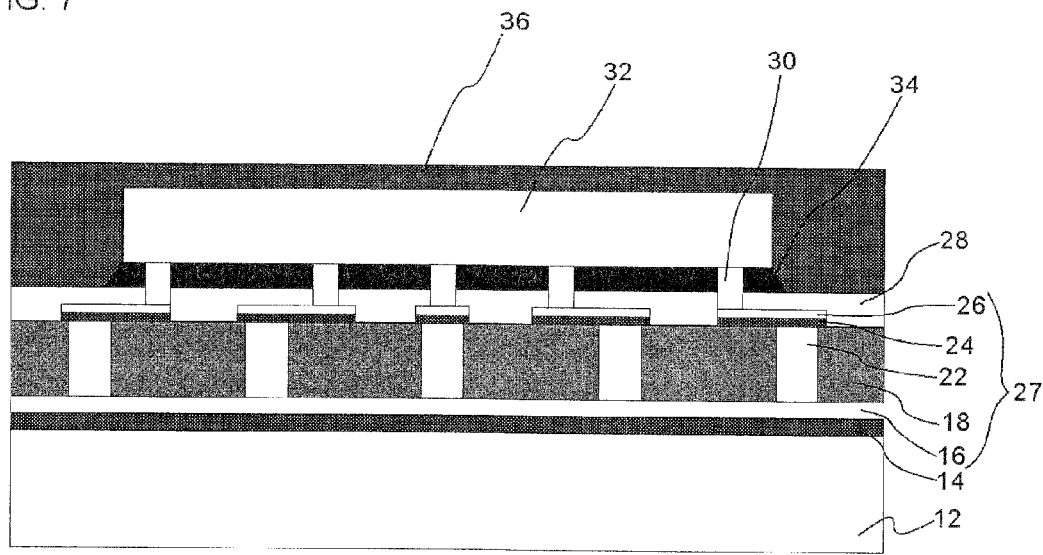

Thereafter, an underfill resin 34 is filled in a gap between the semiconductor chips 32 and the solder resist (FIG. 6). Next, an encapsulating resin layer 36 is formed so as to cover the plurality of semiconductor chips 32 en bloc (FIG. 7).

Figure 8:
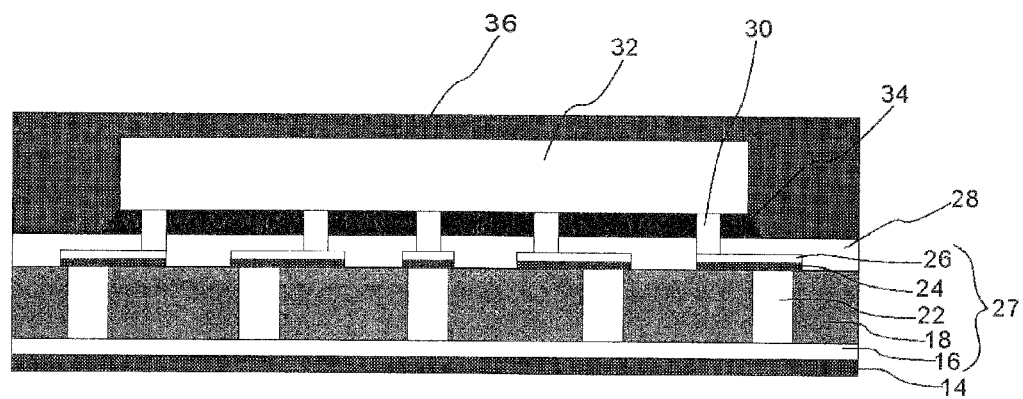

Step (d): A laser having a wavelength transparent with respect to the support base 12 is irradiated from the back side of the support base, selectively to an unmounted region 54 having no semiconductor chips 32 mounted thereon, and thereby the support base 12 is separated from the interconnect layer 27, while inducing the separation so as to originate from the removal layer 14 irradiated by the laser (FIG. 8, FIG. 12).

First, from the back side of the support base 12, a laser having a wavelength transparent with respect to the support base 12 is irradiated, selectively to the unmounted region 54 other than a mounted region 53 having the semiconductor chips 32 mounted thereon (FIG. 12). In this way, the removal layer 14 is irradiated by the laser, and thereby a gas is produced from the removal layer 14.

Methods of selectively irradiating the laser to the unmounted region 54 may be exemplified by a method of irradiating a laser to portions a predetermined distance inwardly away from the outer circumference of the support base 12, and a method of irradiating a laser making use of an alignment mark.

Types of the laser applicable to this embodiment may appropriately be selected, depending on materials composing the removal layer 14, configuration, conditions of manufacture, and so forth. Various types of gas laser and solid laser may be exemplified, typically by excimer laser, Nd-YAG laser, Ar laser, CO2 laser, CO laser, He—Ne laser and so forth. Not only continuous wave, but also pulse wave may be adoptable. This embodiment will be explained referring to an exemplary case of using continuous wave (CW) of fundamental wave of YAG laser (wavelength=1064 nm).

Portions to be irradiated by the laser may be located at four positions arranged at regular intervals from each other, along the outer circumference of the support base 12 as illustrated in FIG. 12, although not specifically limited. Regions to be irradiated may be a 10-mm square. Although the portions to be irradiated were located at four positions in this embodiment, it may be good enough to locate the portion(s) to be irradiated at least one or more positions. The geometry of the regions to be irradiated may be a 10-mm-diameter circle, for example.

Conditions of irradiation of laser may be determined by combining output and scanning speed, within the ranges from 1 to 30 W for the former, and 50 to 8000 mm/sec for the latter. If the laser output is smaller than the above-described range, the removal layer 14 may be given with only an energy insufficient to produce the gas based on a chemical change, and thereby the support base 12 may be separated only to an insufficient degree. The irradiation, carried out only once in this embodiment, may alternatively be carried out a plurality of times under lower output in the same portion, so as to achieve an equivalent effect after integrating the heat energy.

This embodiment will be explained referring to an exemplary case of adopting conditions of 13 W, 5000 mm/sec, and a line pitch of irradiation of 40 µm or smaller.

From the viewpoint of improving warpage of the support base 12 and encapsulating resin layer 36, the laser irradiation process may be carried out while heating the support base 12 on the stage. The temperature range of heating of the support base 12 may be 100 to 200° C. In this embodiment, the temperature of heating was adjusted to 170° C. In addition, the heating the support base 12 in the laser irradiation process may be carried out while physically-fixing the support base 12 on the stage for improving warpage of the support base 12. The method for physically-fixing the support base 12 on the stage includes a method for holding the support base 12 with vacuum and a method for fixing edge of the support base 12 by jig, or the like.

The support base 12 is then separated from the interconnect layer 27, while inducing the separation so as to originate from the removal layer 14 irradiated by the laser (FIG. 8).

The separation may be effected making use of stress, while assuming the laser-irradiated removal layer 14 as an origin of separation. The separation may be accelerated by allowing a liquid to infiltrate into the interface between the support base 12 and the removal layer 14. For example, the laser irradiation may be carried out in a separation liquid or in a water vapor atmosphere, or still alternatively, the support base 12 and the removal layer 14 may be placed in the separation liquid or in the water vapor atmosphere, immediately after the laser irradiation. The separation liquid may be exemplified by water, carbonated water, and aqueous ammonia solution. For the case where the insulating resin layer 18 covers the interface between the support base 12 and the removal layer 14 at the outer circumference of the support base 12, the interface between the support base 12 and the removal layer 14 is exposed by partially removing the insulating resin layer 18. Blades such as cutter or various types of laser may be used for removing the insulating resin layer 18.

Figure 9:
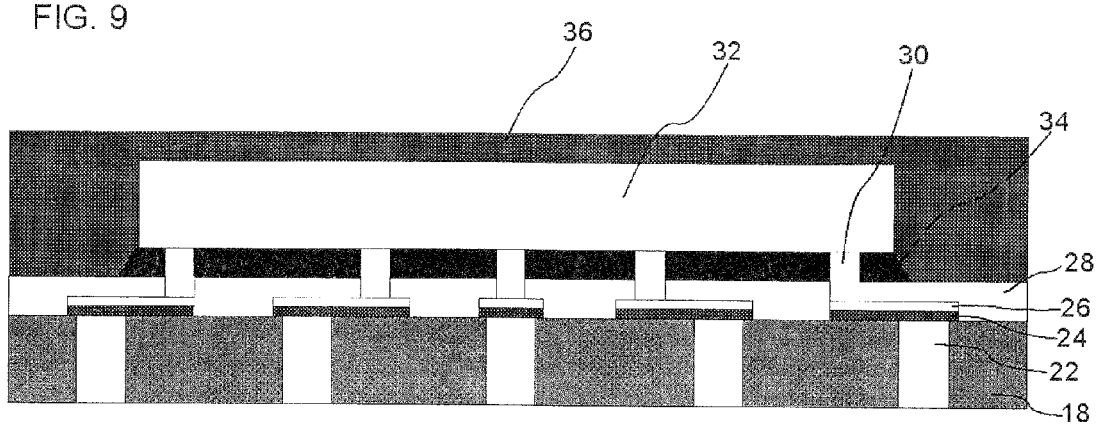

After the support base 12 is separated from the interconnect layer 27, as illustrated in FIG. 9, the removal layer 14 and the seed metal layer 16 are etched off, to thereby expose the via plugs 22.

Figure 10:
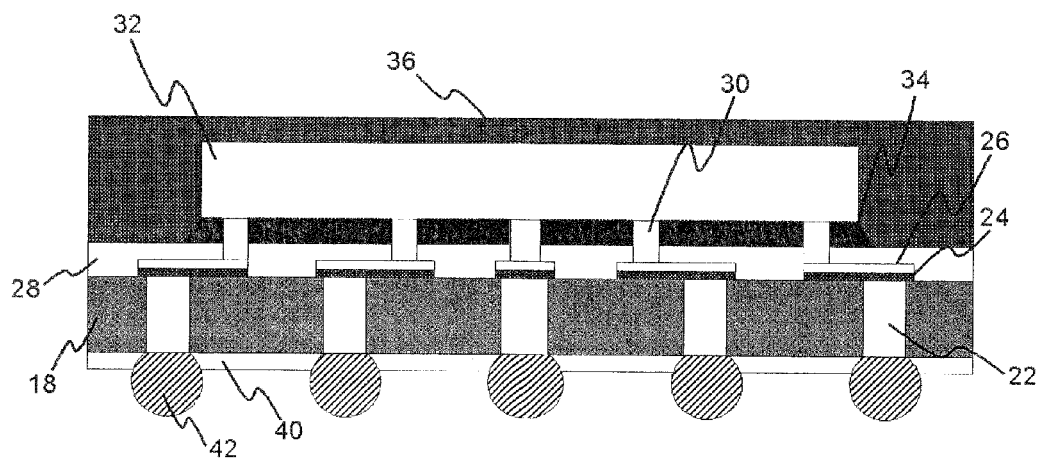

On the back side of the insulating resin layer 18, a solder resist 40 is coated, and openings are formed by photolithography in portions thereof having the via plugs 22 fallen therein. Solder balls 42 are then formed at the openings (FIG. 10).

The mold product is then cut along the dicing lines 50 as illustrated in FIG. 12, to thereby obtain a plurality of semiconductor devices.

The support base 12 may be recycled as the support by removing therefrom the removal layer 14 typically using a mixed solution of sulfuric acid and hydrogen peroxide, followed by washing.

Effects of the first embodiment will be explained below.

The method for manufacturing a semiconductor device of the first embodiment includes the step of selectively irradiating the unmounted region 54 having no semiconductor chips 32 mounted thereon, from the back side of the support base 12, using a laser having a wavelength transparent with respect to the support base 12, while inducing the separation of the support base 12 from the interconnect layer 27 so as to originate from the removal layer 14 irradiated by the laser.

Since, in this embodiment, a laser having a wavelength transparent with respect to the support base 12 is selectively irradiated to the unmounted region 54 having no semiconductor chips 32 mounted thereon, from the back side of the support base 12, any possible damages to the semiconductor chips 32 may be reduced, and thereby the reliability of the obtainable semiconductor devices may be improved.

Since the laser irradiatied selectively to the unmounted region 54 having no semiconductor chips 32 mounted thereon allows the removal layer 14 to produce a gas, the support base 12 may be separated from the interconnect layer 27 while inducing the separation so as to originate from the removal layer 14.

Since the gas is produced in this embodiment from the removal layer 14 irradiated by the laser, the internal pressure rises at the interface between the support base 12 and the removal layer 14. Accordingly, the laser irradiated region of the removal layer 14 may be used as the origin of separation, when the support base 12 is separated from the removal layer 14.

As has been described in the above, the interconnect layer 27 and the semiconductor chips 32 mounted on the interconnect layer 27 may be separated together from the support base 12 by a simple method, so that the throughput in the separation process may be improved, and the production efficiency of semiconductor devices may be excellent.

Second Embodiment

A method for manufacturing a semiconductor device of this embodiment includes the steps below. Note that explanations for any procedures similar to those in the first embodiment will not be repeated.

(a): Forming a removal layer over a base;

(b): forming an interconnect layer over the removal layer;

(c): mounting a plurality of semiconductor chips over the interconnect layer; and (d): forming an alignment mark by modifying a portion of the resin layer composing the interconnect layer, by irradiating a laser having a wavelength transparent with respect to the base from the back side thereof;

(e): positioning the laser irradiation making use of the alignment mark; and (f): irradiating a laser, having a wavelength transparent with respect to the base, along dicing lines which are used for singulating semiconductor devices, while inducing separation of the base from the interconnect layer, so as to originate from the removal layer irradiated by the laser.

The steps (a) to (c) are similar to those in the first embodiment, so that explanations therefor will not be repeated.

Figure 11A:
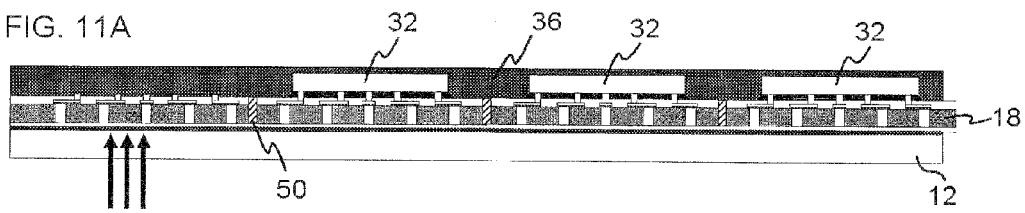
FIGS. 11A to 11C are schematic sectional views sequentially illustrating processes in a method for manufacturing a semiconductor device according to a second embodiment.
Figure 11B:
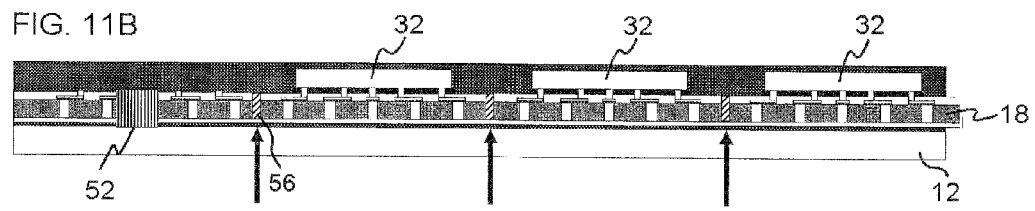

Step (d): The alignment marks 52 are formed by modifying portions of the resin layer (insulating resin layer 18) composing the interconnect layer 27, by irradiating a laser having a wavelength transparent with respect to the support base 12 from the back side of the support base 12 (FIGS. 11A, 11B, and 13).

Types of the laser applicable to formation of the alignment mark 52 may appropriately be selected, depending on materials composing the removal layer 14, configuration, conditions of manufacture[k2], and so forth. Various types of gas laser and solid laser may be exemplified, typically by excimer laser, Nd-YAG laser, Ar laser, CO2 laser, CO laser, He—Ne laser and so forth. Not only continuous wave, but also pulse wave may be adoptable. This embodiment will be explained referring to an exemplary case of using continuous wave (CW) of fundamental wave of YAG laser (wavelength-1064 nm).

Portions to be irradiated by the laser may be located in the unmounted region 54, at four positions arranged at regular intervals from each other, along the outer circumference of the support base 12 as illustrated in FIG. 13, although not specifically limited. Regions to be irradiated may be a 10-mm square. In this way, the alignment mark 52 may be formed.

Although the portions to be irradiated were located at four positions in this embodiment, it may be good enough to locate the portion(s) to be irradiated at least two or more positions. The geometry of the regions to be irradiated may be a 10-mm-diameter circle, for example.

Conditions of irradiation of laser may be determined by combining output and scanning speed, within the ranges from 1 to 30 W for the former, and 50 to 8000 mm/sec for the latter. If the laser output is smaller than the lower limit value, the irradiated portions of the circuit pattern (interconnects 26) cannot be recognized, and consequently cannot function as the alignment marks 52. On the other hand, if the laser output exceeds the upper limit, the irradiated portions of the circuit pattern may be destroyed, and again cannot function as the alignment marks. The irradiation, carried out only once in this embodiment, may alternatively be carried out a plurality of times under lower output along the same line, so as to achieve an equivalent effect after integrating the heat energy.

In this embodiment, the laser is scanned over the region to be irradiated under 8 W, 200 mm/sec, and at a 100-μm pitch. In this way, a circuit pattern of the interconnects 26 in the irradiated portions produces a contrast against the periphery thereof, and is made visually recognizable from the back side. Now the irradiated portions may be used as the alignment marks 52.

Step (e): Positions of laser irradiation is determined making use of the alignment marks 52 (FIG. 11B).

Using the alignment marks 52 and according to a predetermined method, dicing lines 50 for singulating semiconductor devices, between every adjacent semiconductor chips 32 mounted there, are determined as positions of laser irradiation (FIGS. 11A, 11B and 13).

Figure 11C:
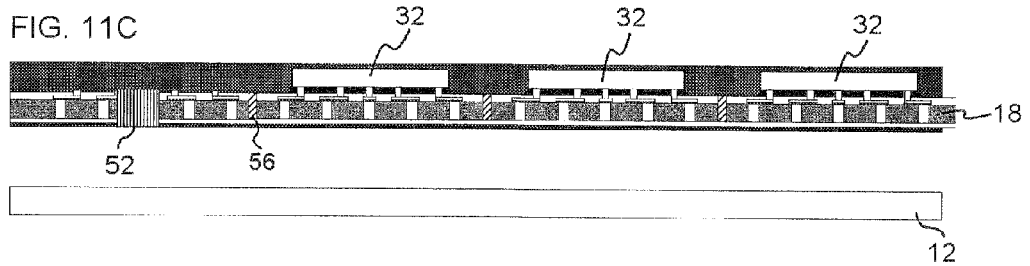

Step (f): A laser, having a wavelength transparent with respect to the base, is irradiated along the dicing lines 50 which are used for singulatirig semiconductor devices, while inducing separation of the support base 12 from the interconnect layer 27, so as to originate from the removal layer 14 irradiated by the laser (FIGS. 11B, 11C and 14).

Types of the laser applicable to step (f) may be exemplified by those used in step (d). This embodiment will be explained referring to an exemplary case of using continuous wave (CW) of fundamental wave of YAP laser (wavelength=1064 nm), similarly to as in step (d).

Conditions of irradiation of laser may be determined by combining output and scanning speed, within the ranges from 1 to 30 W for the former, and 50 to 8000 mm/sec for the latter. If the laser output is smaller than the above-described range, the removal layer 14 may be given with only an energy insufficient to produce the gas based on a chemical change, and thereby the support base 12 may be separated only to an insufficient degree. The irradiation, carried out only once in this embodiment, may alternatively be carried out a plurality of times under lower output on the same line, so as to achieve an equivalent effect after integrating the heat energy. In this embodiment, this sort of laser is irradiated along the dicing lines 50, so as to produce the irradiated regions 56 (FIGS. 11B and 14).

In this embodiment, the interconnects 26 are oxidized while being heated by the laser irradiation, and are changed in color. As a consequence, the interconnects 26 produce a contrast against the peripheral insulating resin layer. In this way, the circuit pattern may be now recognizable from the back side of the support base 12. By using the interconnects 26 changed in color as the alignment marks 52, only the portions on the dicing lines 50, which are the unmounted regions having no semiconductor chips 32 mounted thereon, may exactly be irradiated.

Note that the irradiated regions 56 are not always necessarily formed over the entire range of the dicing lines 50, and may be formed in only a part of the unmounted region 54.

This embodiment will be explained referring to an exemplary case of adopting conditions of 13 W, 5000 mm/sec, and a line pitch of irradiation of 40 μm or smaller.

From the viewpoint of improving warpage of the support base 12 and encapsulating resin layer 36, the laser irradiation process may be carried out while heating the support base 12 on the stage. The temperature range of heating of the support base 12 may be 100 to 200° C. In this embodiment, the temperature of heating was adjusted to 170° C. In addition, the heating the support base 12 in the laser irradiation process may be carried out while physically-fixing the support base 12 on the stage for improving warpage of the support base 12. The method for physically-fixing the support base 12 on the stage includes a method for holding the support base 12 with vacuum and a method for fixing edge of the support base 12 by jig, or the like.

The support base 12 is then separated from the interconnect layer 27, while inducing the separation so as to originate from the removal layer 14 irradiated by the laser (FIG. 11C).

Since the gas is produced in this embodiment from the removal layer 14 irradiated by the laser, the internal pressure rises at the interface between the support base 12 and the removal layer 14. Accordingly, the laser irradiated region of the removal layer 14 may be used as the origin of separation, when the support base 12 is separated from the removal layer 14.

The support base 12 may be separated while being originated from the removal layer 14, by a method similar to that in the first embodiment, and a plurality of semiconductor devices may be obtained. The support base 12 may be recycled as the support by removing therefrom the removal layer 14 typically using a mixed solution of sulfuric acid and hydrogen peroxide, followed by washing.

Effects of the second embodiment will be explained below.

According to the method for manufacturing a semiconductor device of this embodiment, the effects described below will be obtained, in addition to those obtained in the first embodiment.

The method for manufacturing a semiconductor device of this embodiment includes the step of irradiating the laser along the dicing lines 50 which are used for singulating semiconductor devices, making use of the alignment marks 52.

Accordingly, the laser may exactly be irradiated along the dicing lines 50. The laser irradiation may, therefore, be carried out efficiently in the simple method, as compared with the case of irradiation over the entire surface of a wafer, and thereby the throughput may be improved.

Since the irradiated regions 56 of the dicing lines 50 in the vicinity of the semiconductor devices may be used as the origin of separation, so that the support base 12 may thoroughly be separated from the interconnect layer 27 over the entire range of wafer, and thereby the yield of production of semiconductor devices may be improved.

The embodiments of the present invention, having been described in the above referring to the attached drawings, are mere examples of the present invention, and various configurations other than those described in the above may be adoptable.

The interconnect layer 27, formed only as a single layer in the first and second embodiments, may alternatively be given in a stacked form, by repeating predetermined steps of processing.

The semiconductor chips 32, mounted on the interconnect layer 27 in the first and second embodiments, may alternatively be configured to be connected with interconnect components through wire bonding.

In the first and second embodiments, the semiconductor chips 32 may be mounted on both surfaces of the interconnect layer 27, and the individual semiconductor chips 32 may be connected each other through the via plugs 22.

In the first and second embodiments, a single semiconductor device may be configured to have a plurality of semiconductor chips 32 mounted thereon in parallel to each other.

In the first and second embodiments, a single semiconductor device may be configured to have a plurality of semiconductor chips 32 stacked thereon, wherein each semiconductor chip 32 is connected to interconnect components through wire bonding or throughhole electrodes like as through silicon vias.

Step (d) for forming the alignment marks 52 in the second embodiment may be placed between step (b) and step (c).

In the second embodiment, also a part of the interconnect layer 27 may be made recognizable by modifying or removing the removal layer 14, and may be used as the alignment marks.

In the second embodiment, SHG-YAG laser (wavelength=532 nm) may be used for forming the alignment marks 52 and for irradiation on the dicing lines 50. The SHG-YAG laser having the above wavelength may not only be absorbed by the removal layer containing copper oxide or the like, but also by the seed metal layer 16 which generally reflects most part of the fundamental wave of YAG, so that the heating may efficiently be proceeded.

In the second embodiment, the alignment marks 52 may be used for processes based on laser irradiation from the top side of the support base 12. In other words, the alignment marks 52 may be useful not only for positioning in the laser irradiation from the back surface of the support base 12, but also for the processes based on laser irradiation in need of positioning on the top side. In particular, this embodiment enables exact laser processes on the surface of resin of molded products.

It is apparent that the present invention is not limited to the above embodiment, which may be modified and changed without departing from the scope and spirit of the invention.

What is claimed is:

1. A method for manufacturing a semiconductor device comprising:
    forming a removal layer over a base;
    forming an interconnect layer over said removal layer;
    mounting semiconductor chip(s) over said interconnect layer; and
    separating said base from said interconnect layer while inducing the separation so as to originate from said removal layer, by irradiating a laser having a wavelength transparent with respect to said base from the back side thereof, selectively to an unmounted region having no semiconductor chip(s) mounted thereon.

2. The method for manufacturing a semiconductor device as claimed in claim 1,
    wherein in said mounting said semiconductor chip(s),
    a plurality of said semiconductor chips are mounted over said interconnect layer, and
    wherein said separating said base from said interconnect layer further includes:
    irradiating said laser along dicing lines used for singulating semiconductor devices.

3. The method for manufacturing a semiconductor device as claimed in claim 1, wherein separating said interconnect layer allows said removal layer to generate a gas, upon irradiation of said laser to said removal layer.

4. The method for manufacturing a semiconductor device as claimed in claim 3, wherein said removal layer contains at least one compound selected from the group consisting of metal oxide, metal nitride and metal oxinitride.

5. The method for manufacturing a semiconductor device as claimed in claim 1, wherein said base is composed of glass, quartz glass, sapphire, aluminum nitride or silicon.

6. The method for manufacturing a semiconductor device as claimed in claim 1, wherein said interconnect layer is composed of a resin layer formed over said base, and a metal layer buried in said resin layer, and
    wherein the method further comprises, after said forming said interconnect layer, and before said separating said base from said interconnect layer:
    forming an alignment mark by irradiating a laser having a wavelength transparent with respect to said base from the back side thereof to modify said removal layer or a portion of said resin layer composing said interconnect layer, and
    wherein said separating said base from said interconnect layer further includes:
    positioning said laser irradiation making use of said alignment mark.

7. The method for manufacturing a semiconductor device as claimed in claim 6, wherein said forming said alignment mark includes:
    forming said alignment mark recognizable from the back side of said base from a part of said metal layer by irradiating said laser from the back side of said base to modify a portion of said removal layer into a transparent portion.

8. The method for manufacturing a semiconductor device as claimed in claim 6, wherein said forming said alignment mark includes:
    forming an alignment mark by irradiating said laser having a wavelength transparent with respect to said base from the back side thereof to modify a portion of said interconnect layer.

9. The method for manufacturing a semiconductor device as claimed in claim 1, wherein said separating said base from said interconnect layer includes:

immersing said base having said semiconductor chip(s) mounted thereon into a separation liquid, so as to allow said separation liquid to infiltrate into the interface between said base and said removal layer, to thereby induce the separation.

10. A method for manufacturing a semiconductor device comprising:

forming a removal layer over a base;

forming an interconnect layer over said removal layer, said interconnect later composes of a resin layer formed over said base, and a metal layer buried in said resin layer;

forming an alignment mark by irradiating a laser having a wavelength transparent with respect to said base from the back side thereof to modify said removal layer or a portion of said resin layer composing said interconnect layer;

mounting semiconductor chip(s) over said interconnect layer; and separating said base from said interconnect layer while inducing the separation so as to originate from said removal layer, by irradiating a laser having a wavelength transparent with respect to said base from the back side thereof, wherein said alignment mark is used for positioning of said laser irradiation.

11. The method for manufacturing a semiconductor device as clsimed in claim 10, wherein said removal layer includes one of a metal oxide, a metal nitride, and a metal oxynitride.

12. The method for manufacturing a semiconductor device as claimed in claim 10, wherein in said mounting said semiconductor chip(s), a plurality of said semiconductor chips are mounted over said interconnect layer, and wherein said separating said base from said interconnect layer further includes:

irradiating said laser along dicing lines used for singulating semiconductor devices.

13. The method for manufacturing a semiconductor device as claimed in claim 10, wherein separating said interconnect layer allows said removal layer to generate a gas, upon irradiation of said laser to said removal layer.

14. The method for manufacturing a semiconductor device as claimed in claim 10, wherein said base is composed of glass, quartz glass, sapphire, aluminum nitride or silicon.

15. The method for manufacturing a semiconductor device as claimed in claim 10, wherein said forming said alignment mark includes:

forming said alignment mark recognizable from the back side of said base from a part of said metal layer by irradiating said laser from the back side of said base to modify a portion of said removal layer into a transparent portion.

16. The method for manufacturing a semiconductor device as claimed in claim 10, wherein said forming said alignment mark includes:

forming an alignment mark by irradiating said laser having a wavelength transparent with respect to said base from the back side thereof to modify a portion of said interconnect layer.

17. The method for manufacturing a semiconductor device as claimed in claim 10, wherein said separating said base from said interconnect layer includes:

immersing said base having said semiconductor chip(s) mounted thereon into a separation liquid, so as to allow said separation liquid to infiltrate into the interface between said base and said removal layer, to thereby induce the separation.

* * * * *